United States Patent [19]

Sinclair

[11] 4,187,606

[45] Feb. 12, 1980

[54] FLEXIBLE ELECTRICAL JUMPER AND METHOD OF MAKING SAME

[75] Inventor: William Y. Sinclair, Stockton, N.J.

[73] Assignee: Aries Electronics, Inc., Frenchtown, N.J.

[21] Appl. No.: 903,898

[22] Filed: May 8, 1978

[51] Int. Cl.² .................... H01R 13/04; H01R 31/08
[52] U.S. Cl. ................................ 29/629; 29/630 C; 339/19
[58] Field of Search ................ 29/629, 628, 630 A, 29/630 B, 630 C, 630 R; 339/17 F, 19

[56] References Cited

U.S. PATENT DOCUMENTS

| | | |
|---|---|---|
| 3,239,916 | 3/1966 | Love .................................. 339/17 F |
| 3,601,755 | 8/1971 | Shiells, Jr. ............................ 339/19 |
| 3,920,301 | 11/1975 | Roberts et al. ..................... 339/17 F |
| 3,997,229 | 12/1976 | Narozny et al. ............... 339/17 F X |
| 4,064,622 | 12/1977 | Morris et al. ................. 29/630 B X |
| 4,085,502 | 4/1978 | Ostman et al. ............... 339/17 F X |

Primary Examiner—Francis S. Husar
Assistant Examiner—C. J. Arbes
Attorney, Agent, or Firm—Anthony J. Casella

[57] ABSTRACT

In a method for making a flexible electrical jumper, an elongated flat strip of electrically conductive material is die-cut to form a plurality of electrical leads interconnected by a carrier strip which extends along the longitudinal axis of the strip of conductive material. Each lead includes a central, flexible flat portion, and opposed contoured ends which are formed into generally U-shaped cross-sections. Sheets of insulative plastic material are laminated to the opposite sides of the central flat portion of the strip to embed the leads therein, with the contoured ends being exposed. The carrier strip is removed and the insulating material is cut at the desired locations, depending on the number of leads required for the flexible jumper. The method of the invention is carried out in a continuous operation, and the resulting flexible jumper is characterized by the exposed termination ends which are rigid and have generally arcuate, U-shaped cross-sections.

5 Claims, 18 Drawing Figures

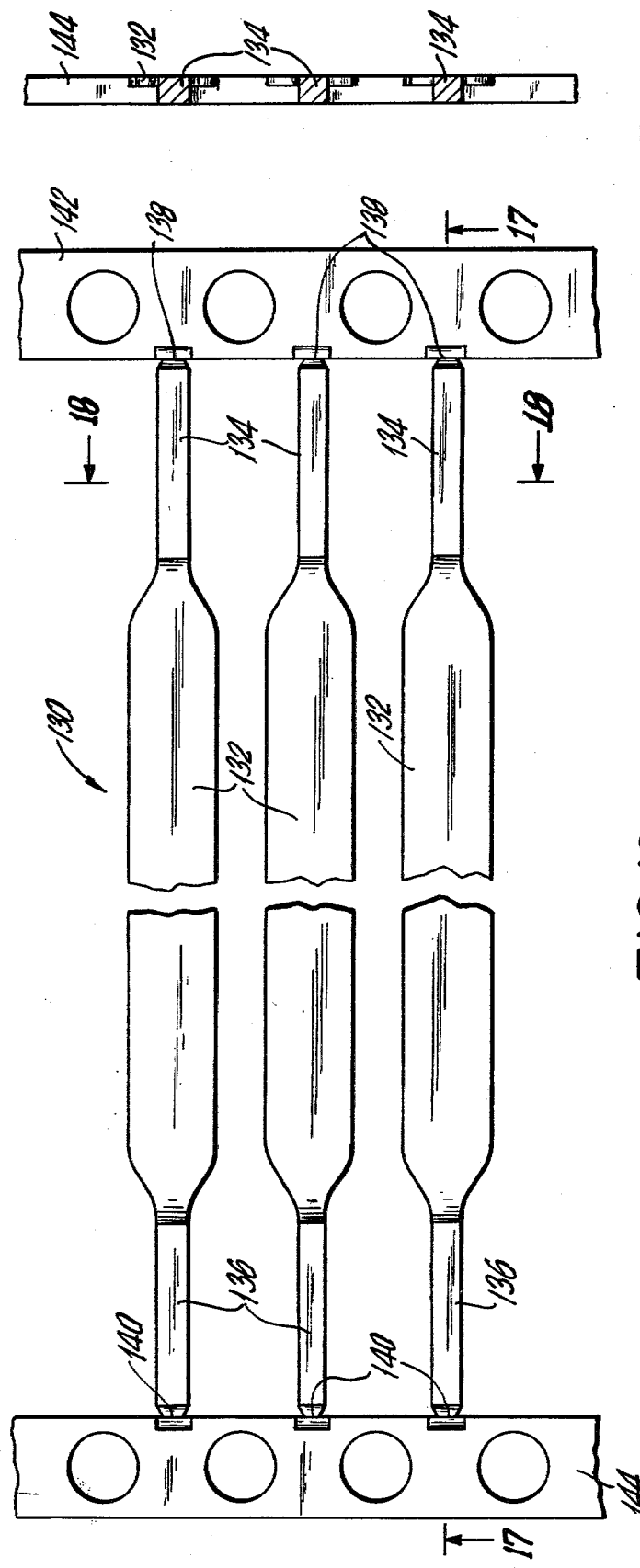
FIG.18
FIG.16
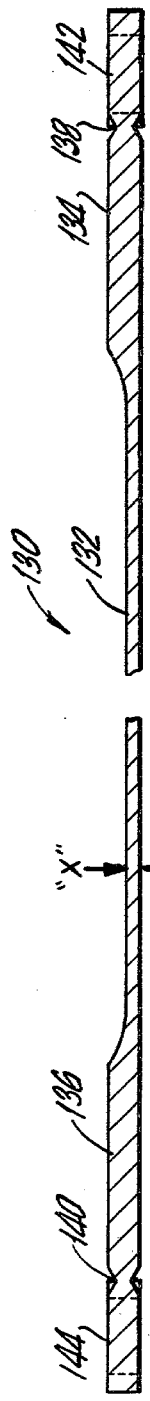
FIG.17

FLEXIBLE ELECTRICAL JUMPER AND METHOD OF MAKING SAME

The present invention relates to connectors for use in electrical circuitry, commonly referred to as electrical jumpers and also to methods of making same.

In sophisticated electronics systems, the use of flexible jumpers quite often is not an alternative but an absolute necessity dictated by structural features or the requirements of high density. In the interconnection of printed circuit boards, for instance, it is often required to employ electrical jumpers to interconnect the leads of stacked printed circuit boards, thereby reducing assembly labor, and most often improving the reliability of the electronics sub-system.

Jumper cables are usually short and contain a pattern of flat, parallel, co-planar conductors totally insulated except at each end. The conductors protruding from the insulation should be rigid, prepared for insertion and/or soldering to an electronic component or a printed circuit board. Although the conductors are flat, the protruding terminals are usually round solid pins or tubes, as found, for example, in U.S. Pat. No. 3,601,755.

In prior art methods for forming electrical jumpers, it has heretofore been known to initially start with a strip of flat conductive material, strip off the opposed ends of the flat conductor cable to expose the round wires for forming the terminations of the jumper. Next, in order to obtain the desired flexibility of the intermediate portion of each lead, it was necessary to change the cross-section of the conductor from a round cross-section to a generally flat cross-section. Heretofore, this flattening was accomplished by placing the intermediate portion of the leads or wires between rollers so that during such flattening, the cross-section of the wire is changed from round to generally rectangular. The prior art process is carried out in a batch technique, rather than in a continuous process, thus resulting in a costly method of manufacture.

It is an object of the subject invention to provide a new and improved process for making a flexible electrical jumper wherein the method of manufacture is carried out in a continuous process, thereby resulting in a less costly, and more efficient manufacturing technique. Still further, the resulting flexible electrical jumper is characterized by having exposed termination ends which are rigid and made of contoured flat strip material, having a generally U-shaped cross-section. The termination ends have inherent resiliency and are adapted to conform to the size of openings in electronics components in which the jumper is connected. Furthermore, by virtue of the inherent resiliency of the electrically conductive contoured ends, a constant biasing force is established in the interconnection between the jumper and the socket within the electrical components, thereby increasing the reliability of the connection. The contoured ends of the jumper may also be characterized by the addition of projections for further increasing the electrical reliability of the interconnection between the jumper and the electronic component, and in an alternate embodiment, the contoured ends of the jumper are tapered so as to facilitate insertion of the contoured end into an electrical component.

The new and improved method of the subject invention generally comprises the steps of providing an elongated flat strip of electrically conductive material, and die-cutting said strip to form a plurality of generally elongated, parallel leads extending transverse to the longitudinal axis of the strip. The leads are interconnected by a carrier strip which extends parallel to the longitudinal axis of the strip of conductive material. Each lead includes a flat, flexible central portion, and has opposed ends, each of which is contoured in an arcuate, generally U-shaped cross-section, and which may be tapered in width from the central portion thereof to the free end thereof. Next, the central portions of the array of leads are embedded within a strip of flat, flexible electrically insulating plastic material, after which the carrier strip is removed from the ends of the leads.

The resulting flexible electrical jumper is characterized by flat, flexible central portions which are embedded within an insulating material, and contoured termination ends having generally U-shaped cross-sections. If desired, projections may be formed in the termination ends for increasing the reliability of the electrical connection of the jumper to the electronic apparatus. Alternatively, the termination ends of the jumper may be tapered in width. In a further modification, prior to the die-cutting of the electrically conductive strip, the central portion of the strip may be reduced in thickness by milling out the strip along the longitudinal axis thereof to further decrease the resulting cross-sectional area of the central flexible protions of the leads in the flexible jumper.

Further objects and advantages of the invention will become apparent from the following detailed description taken in conjunction with the drawings, in which:

FIG. 16 is a plan view of a strip of a electrically conductive material during an intermediate step of an alternate process of the subject invention for making a flexible electrical jumper;

FIG. 17 is a cross-sectional view taken along line 17—17 in FIG. 16; and

FIG. 18 is a cross-sectional view taken along line 18—18 in FIG. 16.

Figure 1:
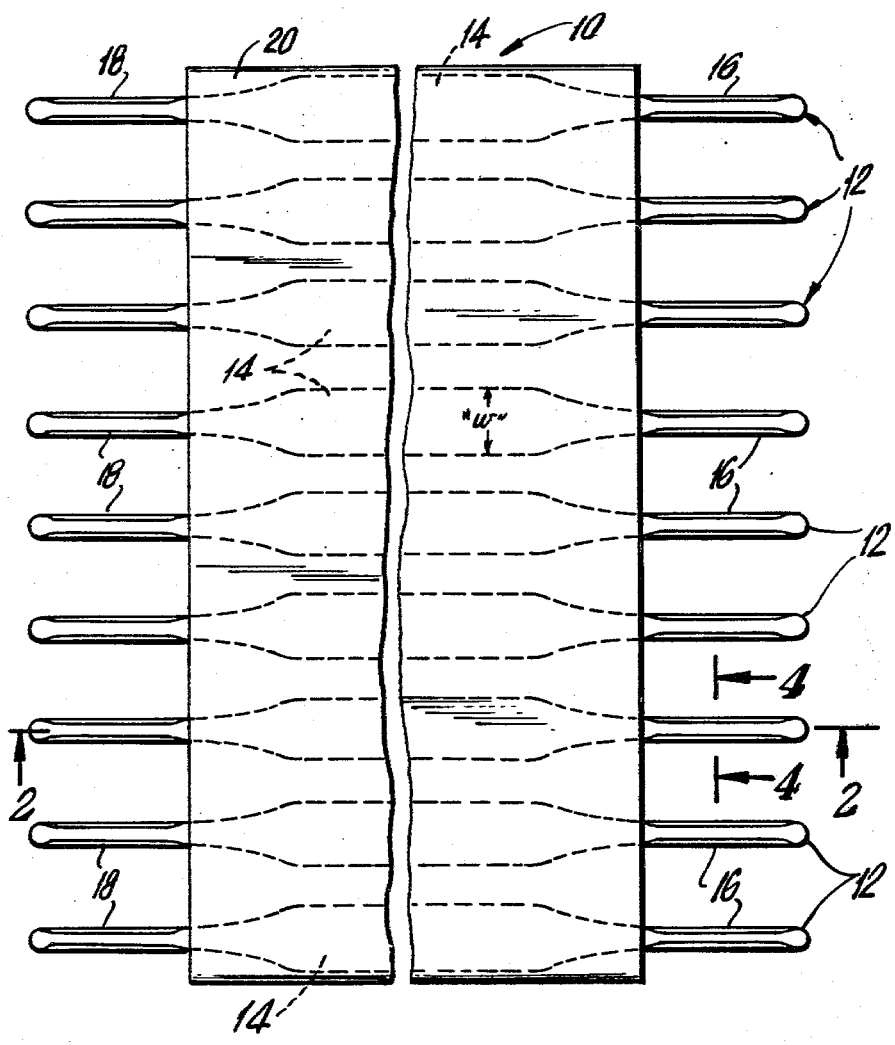
FIG. 1 is a plan view of a flexible electrical jumper of the subject invention.
Figure 2:
FIG. 2 is a cross-sectional view taken along line 2—2 in FIG. 1.
Figure 3:
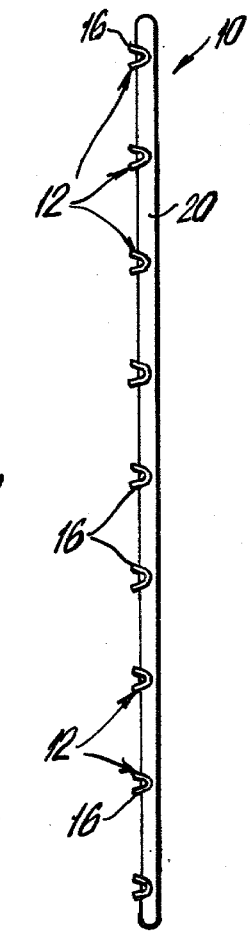
FIG. 3 is a side elevational view of a flexible electrical jumper made according to the subject invention.
Figure 4:
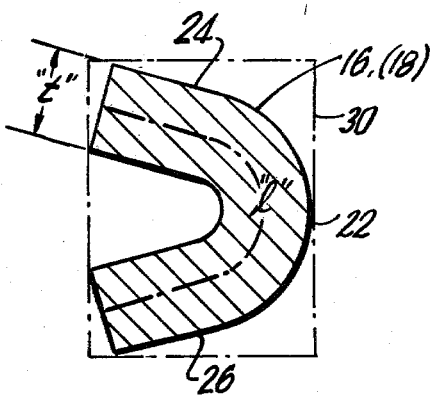
FIG. 4 is a sectional view taken along line 4—4 in FIG. 1.

Turning to FIGS. 1 through 3, the flexible electrical jumper of the subject invention is generally designated by the numeral 10, and basically comprises an integral construction of a plurality of generally parallel, identical electrical conductors or leads 12 which are supported intermediate their ends by a strip of flat, flexible, electrically insulated sheet material 20. Each electrical conductor 12 is formed from a flat sheet of material, such as spring tempered brass alloy, and includes a central, flat flexible portion 14, and opposed contoured ends 16, 18. The central portion 14 is embedded in an electrically-insulated plastic sheet 20 so as to maintain the individual conductors 12 in spaced relation, insulated one from the other. On the other hand, the opposed contoured ends 16, 18 are exposed, and are thus adapted to be soldered or mechanically connected to the required electrical circuits, as more fully described hereinafter. The flat flexible center portion 14 of each electrical head 12 is dimensioned to achieve the required flexibility, with the width "w" of the central portion being on the order of 0.060 inches, and the thickness "t" being on the order of 0.006 inches. Thus the cross-sectional area of the central portion 14 is 0.00036 square inches. Each contoured end 16, 18 of the electrical conductor 12 extends beyond the insulated, laminated plastic sheet 20, and generally perpendicular to the longitudinal axis thereof. Each end 16, 18 is contoured into a generally arcuate, U-shaped cross-section, as more particularly illustrated in FIG. 4, and has a thickness "t" corresponding to the thickness of central portion 14, i.e., 0.006 inches. The generally U-shaped contoured end basically comprises a base 22 and two arms 24, 26, with the total length "l" of the medium line extending along the cross-section of the exposed end being on the order of 0.030 inches. Thus, the cross-sectional area of each exposed end of the electrical lead 12 is on the order of 0.00018 square inches. As shown in FIG. 4, the cross-section of the exposed end is proportioned so as to be accommodated within a standard size aperture in an electrical component, as designed by the dotted line 30 in FIG. 4, on the order of 0.017 inches by 0.019 inches. By virtue of the contoured, arcuate, generally U-shaped configuration of the exposed ends 16, 18 of each electrical lead, and the fact that such exposed ends are formed of a resilient metallic material, the resulting construction of the exposed ends provides a degree of resiliency so as to aid in maintaining electrical contact between the ends 16, 18 of the lead 12 and the aperture 30 in which the exposed end is secured. Alternatively, the ends 16, 18 may be secured to the electronic component or printed circuit board by other conventional means such as soldering, welding, brazing or mechanical joining techniques. As illustrated in FIGS. 1 and 3, the generally U-shaped cross-section of the exposed ends 16, 18 extend substantially along the entire length of each exposed end, and thus the U-shaped configuration inherently provides structural rigidity to the exposed end, which is important in order to insure a rigid protruding end for the jumper 10 which is required for termination purposes.

Figure 5:
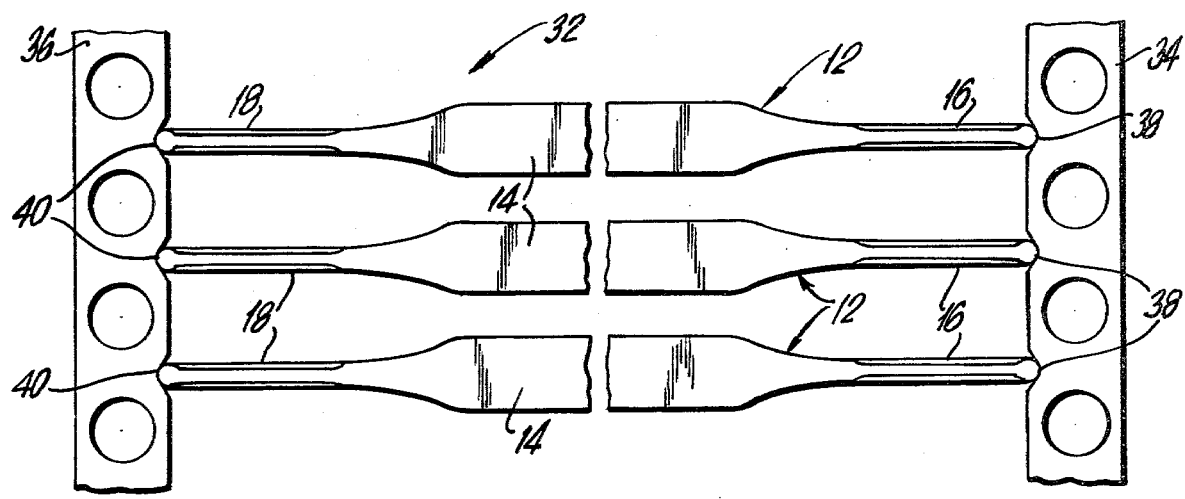
FIG. 5 is a plan view of a strip of electrically conductive material following the step of die-cutting same according to the process of the subject invention.
Figure 6:
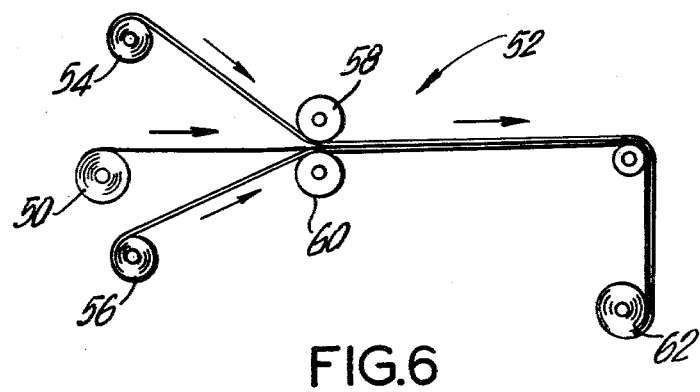
FIG. 6 illustrates another step of the process of the subject invention wherein insulating material is laminated to the strip of die-cut electrically conductive material.
Figure 7:
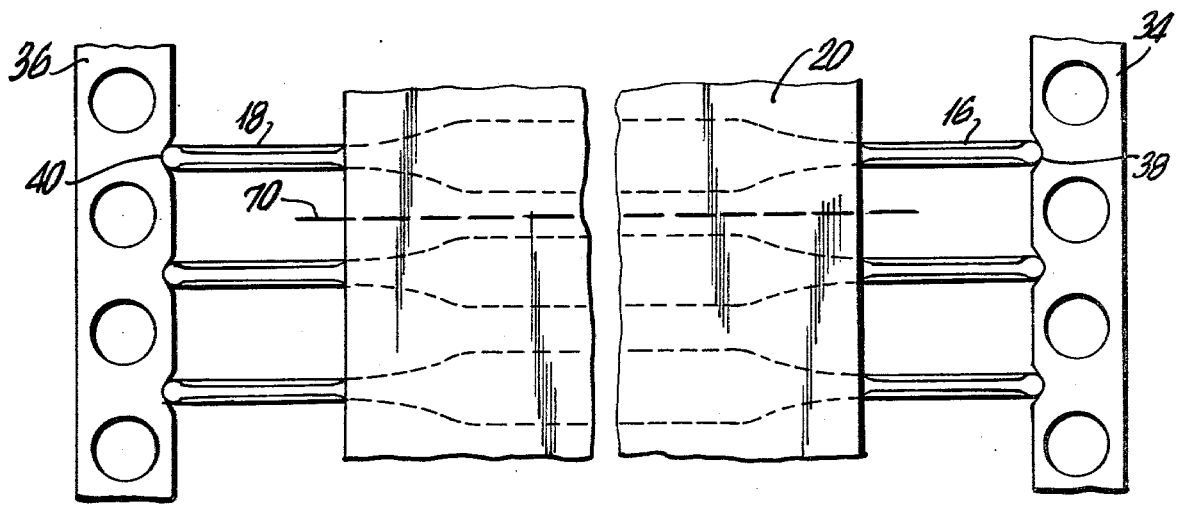
FIG. 7 is a plan view of the laminated strip of electrically conductive material which is an intermediate step in the subject process for making a flexible electrical jumper.

FIGS. 5 through 7 illustrate several steps in the new and improved process for making a flexible electrical jumper of the type illustrated in FIGS. 1 through 4.

In the first step of the subject process, an elongated strip of electrical conductive material, such as spring tempered brass of uniform thickness on the order of 0.006 inches, is die-cut to form a plurality of generally parallel electrical conductors 12 having the configuration as described above with reference to FIGS. 1 through 4, and furthermore including carrier means for maintaining the electrical conductors in spaced relationship. As shown in FIG. 5, the strip of electrically conductive material 32 has been die-cut to include a plurality of electrical leads or conductors 12 which are unitary with carrier means in the form of two carrier strips 34 and 36, with the exposed ends 16 and 18 of each lead being connected to the carrier strips 34 and 36 along weakened, partially sheared interconnections 38 and 40, respectively. The parallel array of electrical leads 12 are disposed generally perpendicular to the longitudinal axis of the elongated strip 32 and the die-cutting of the strip 32 is performed in a continuous process utilizing die-cutting equipment, after which the elongated strip may then be rolled about a reel for the next step in the subject process.

As illustrated in FIG. 6, the reel 50 of formed conductive strip 32 is placed on a lamination apparatus 52 along with two reels 54 and 56 of insulated plastic sheet material, such as polyethylene or other suitable plastic material. The width of each plastic sheet corresponds to the length of the flat, flexible central portions 14 of the leads 12. The conductive strip 32, as well as the two elongated sheets of plastic material are passed between the nips of rolls 58, 60, where heat and pressure may be applied for laminating the plastic sheets, with the strip 32 disposed therebetween, to form a unitary structure with the central portions 14 of the electrical leads being embedded within the insulated sheet 20, as shown in FIG. 7. The resulting composite structure may then be rolled about a reel, designated by the numeral 62.

Referring to FIG. 7, the resulting laminated construction includes the electrical conductors 12 having their flexible central portions 14 embedded within the insulated sheet 20, so as to be maintained in spaced, electrically isolated disposition, and with the opposite ends 16, 18 being connected to the carrier strips 34, 36. The step of laminating the insulating sheet to the central portions 14 of the electrical heads 12 is carried out in a continuous process, as illustrated in FIG. 6, thereby greatly facilitating the manufacture of the flexible electrical jumpers of the subject invention.

In the next step of the subject process, the carrier strips 34 and 36 may be readily removed by mechanical working of the carrier strip so as to cause rupture of the partial sheared connections 38 and 40. Next the insulation sheet 20 may be severed at two spaced locations intermediate the spaced leads 12 to form a flexible electrical jumper (see FIG. 1) having the desired number of leads. As an example of the line of severing of plastic sheet 20, reference is made to FIG. 7 wherein a sever line 70 is indicated, and extends transverse to the longitudinal axis of the plastic sheet 20 and intermediate the leads 12.

As shown in FIG. 1, the jumper includes nine electrical conductors or leads 12, each of which includes the central flexible portion 14 that is embedded in the insulated sheet 20, and exposed, rigid termination ends 16, 18 of generally arcuate, U-shaped cross-section.

Figure 8:
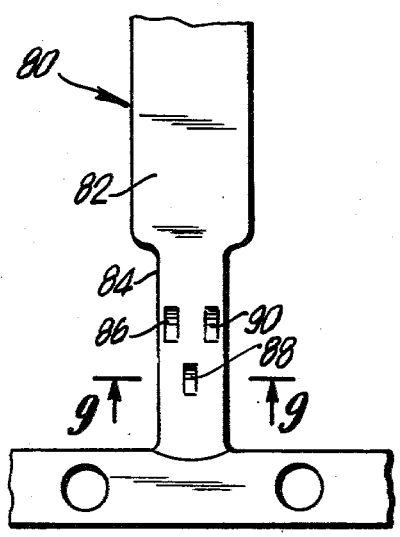
FIG. 8 is a partial plan view of an electrical lead attached to a carrier strip according to a second embodiment of the subject invention.
Figure 9:
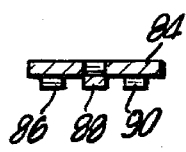
FIG. 9 is a cross-sectional view taken along line 9—9 in FIG. 8.
Figure 10:
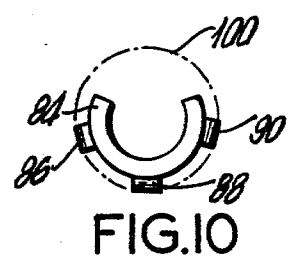
FIG. 10 is an end view of the resulting termination end of an electrical lead according to the second embodiment of the subject invention.
Figure 12:
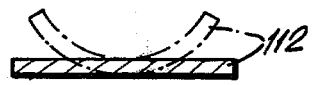
FIG. 12 is a cross-sectional view taken along line 12—12 in FIG. 11.

FIGS. 8 through 10 illustrate an alternate embodiment of the subject flexible electrical jumper, as well as an alternate process of the subject invention. As shown in FIG. 8, each electrical lead 80 includes a flexible flattened central portion 82, as well as opposed ends 84, each of which is provided with a plurality of dimples or projections, designated by the numbers 86, 88 and 90. Each projection is formed by two spaced shear lines which are formed in the strip of electrically conductive material during the formation of the leads 80. The projections may be readily formed utilizing conventional die-cutting apparatus, after which each exposed end portion 84 of the lead 80 is formed into a generally arcuate, U-shaped configuration (See FIG. 10) of a suitable size to resiliently engage the inner wall of an electrical component, designed by the numeral 100 in FIG. 10.

Figure 11:
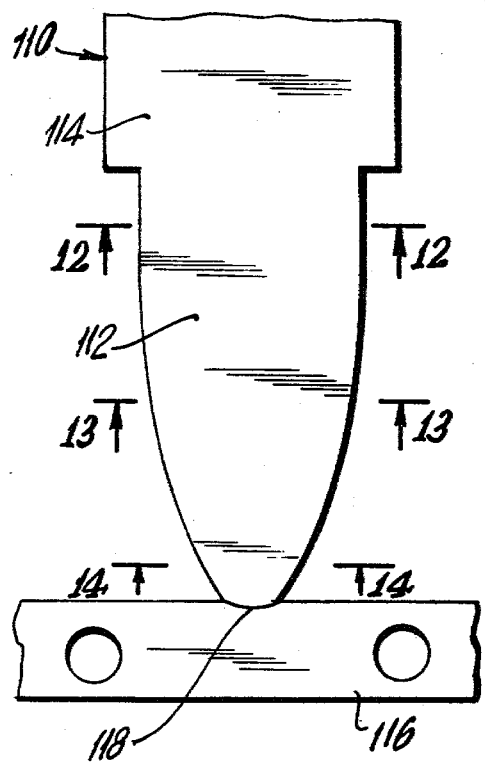
FIG. 11 is a plan view of a third embodiment of an electrical lead forming a portion of the flexible electrical jumper of the subject invention.
Figure 13:
FIG. 13 is a cross-sectional view taken along line 13—13 in FIG. 11.
Figure 14:
FIG. 14 is a cross-sectional view taken along line 14—14 in FIG. 11.
Figure 15:
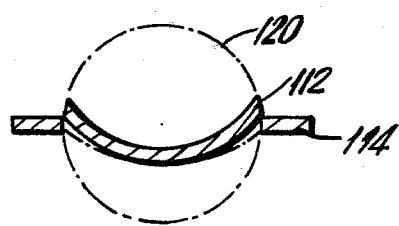
FIG. 15 is a cross-sectional view depicting the assembly of an electrical lead, as shown in FIG. 11, in an electrical component.

In a third embodiment of the subject invention, a shown in FIGS. 11 through 15, the exposed end 112 of an electrical lead 110 may be formed as to include a tapered width extending from the flattened portion 114 to the partial sheared interconnection 118 with the carrier strip 116. After formation of the tapered exposed ends 112, as shown in FIG. 11, and in the solid line portions of FIGS. 12 through 14, each electrical lead is formed into a generally U-shaped, arcuate cross-section, as illustrated in dotted lines in FIGS. 12 through 14. The tapering of the exposed end 112, as well as the arcuate curvature thereof enables the exposed end 112 of the lead 110 to be forcibly inserted into a smaller opening, designed 120 in FIG. 15, of an electrical component in order to establish a resilient, biased interconnection between the electrical lead and the component.

FIGS. 16 through 18 illustrate a further embodiment of the subject invention wherein the elongated flat strip of electrically conductive material which is employed in the subject process to form the plurality of electrical leads and the carrier strip is first reduced in thickness along the central portion thereof, corresponding to the flat flexible central portions of the leads which are subsequently embedded within the sheet of plastic material. More particularly, an elongated flat strip of electrically conductive material 130, such as spring tempered brass, which is initially of uniform thickness on the order 0.015 inches, is milled out along the longitudinal axis thereof in the central portion thereof, as designated by the numeral 132. As an example, the central portion 132 of the flexible strip of conductive material 130 may be milled to a thickness "x" on the order of 0.006 inches. Next, the electrically conductive strip is die-cut to form the opposed ends 134 and 136, which may be of generally rectangular cross-section, on the order of 0.015 inches. Thus, the cross-sectional area of each exposed end 134, 136 of a leadis on the order of 0.0003 square inches, whereas the central portion 132 of each lead, having a thickness of 0.006 inches, and a width of 0.060 inches, has a cross-sectional area of 0.00036 square inches.

As illustrated in FIGS. 16 and 17, the extreme ends 134, 136 of the leads are contoured to a reduced cross-sectional area to define weakened areas 138, 140 to facilitate breaking off of the carrier strips 142, 144 from the electrical leads, following the step of embedding the milled out central portions 132 within the strip of insulating plastic material (not shown). The resulting construction of the flexible electrical jumper made according to the process as illustrated in FIGS. 16 through 18 includes rigid, generally square cross-sectional exposed ends 134, 136 to facilitate connection by soldering or mechanical interconnection, with electrical components or leads of printed circuit boards.

Accordingly, there is provided a new and improved flexible electrical jumper, and a process for making same. The process of the subject invention is carried out in a continuous manner, whereby the resulting construction is in the form of a plurality of electrical leads, the central portions of which are embedded in electrically insulated material. The leads are temporarily interconnected by a carrier strip means formed unitary with the electrical leads during the initial die-cutting operation. In the final steps of the subject process during which the carrier strip means are removed, and the insulated material is severed at two spaced locations intermediate the spaced leads, any number of electrical connectors of the flexible electrical jumper may be obtained as required for the particular interconnection. Furthermore, by virtue of the subject process, the resulting flexible electrical jumper includes a central flexible portion and rigid exposed ends, which rigidity may be achieved by the arcuate, U-shaped cross-section of the embodiments illustrated in FIGS. 1–4, 8–10, and 11–15, or the substantially square leads of the embodiment illustrated in FIGS. 16 through 18. In the alternate embodiment of making a flexible electrical jumper according to the subject invention, the elongated flat strip of electrically conductive material may be suitably processed, such as by milling, to remove the central portion of the strip along the longitudinal axis thereof. Next, the strip may then be formed into the desired configuration of an arrary of parallel leads interconnected by carrier means utilizing conventional die-cutting machinery, followed by lamination of electrically insulated flexible sheets to opposite sides of the flexible, flat central portions of the leads to embed same therein. Next, the carrier means are removed, followed by severing of the insulating sheet to form the flexible electrical jumper.

Although the invention has been described and illustrated with respect to several particular embodiments, it will be obvious to those skilled in the art that changes and modifications may be made without departing from the invention in its broader aspects and, therefore, the aim in the appended claims is to cover all such changes and modifications as fall within the true spirit and scope of the invention.

I claim:

1. A method of making a flexible electrical jumper comprising the steps of:

providing an elongated flat strip of electrically conductive material;

milling out of the central portion of the strip along the longitudinal axis thereof;

forming said strip into a plurality of elongated, generally parallel leads extending transverse to the longitudinal axis of the strip and being interconnected by a carrier which extends along the longitudinal axis of the strip of conductive material, each lead including a central flat portion formed in the milled out portion of the strip, and opposed ends disposed in the portion of the strip which is not milled, at least one of said ends being releasably connected to said carrier strip;

embedding the central portions of the array of leads within a strip of flat flexible electrically insulating material; and removing said carrier strip from the ends of the leads.

2. A method of making a flexible electrical jumper as in claim 1 including the further step of severing the electrically insulating material at two spaced locations intermediate the spaced leads to form a flexible electrical jumper having a specified number of leads.

3. A method of making a flexible electrical jumper as in claim 1 wherein said electrical leads are embedded in the strip of electrically insulating material by laminating two sheets of electrically insulating material to opposite sides of the central portion of the leads.

4. A method of making a flexible electrical jumper as in claim 1 wherein said strip of electrically conductive material is formed to include two elongated carrier strips, each respectively disposed at opposite ends of the leads.

5. A method of making a flexible electrical jumper as in claim 1 wherein said strip of electrically conductive material is formed by a die-cutting operation.

* * * * *